United States Patent
Park et al.

(10) Patent No.: US 8,866,518 B2
(45) Date of Patent: Oct. 21, 2014

(54) POWER TRACKING CIRCUIT AND SEMICONDUCTOR APPARATUS INCLUDING THE SAME

(71) Applicant: SK Hynix Inc., Icheon-si (KR)

(72) Inventors: Min Su Park, Icheon-si (KR); Hoon Choi, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/711,566

(22) Filed: Dec. 11, 2012

(65) Prior Publication Data

US 2013/0321046 A1 Dec. 5, 2013

(30) Foreign Application Priority Data

Jun. 1, 2012 (KR) .................. 10-2012-0059297

(51) Int. Cl.
*H03L 7/00* (2006.01)
*H03L 5/00* (2006.01)

(52) U.S. Cl.
CPC ..................... *H03L 5/00* (2013.01)
USPC ............. 327/143; 327/142; 327/198

(58) Field of Classification Search
USPC .............. 327/141, 144–163; 331/15–17; 375/373–376
See application file for complete search history.

(56) References Cited

U.S. PATENT DOCUMENTS

| | | | | |
|---|---|---|---|---|
| 5,003,196 A | * | 3/1991 | Kawaguchi | 327/62 |
| 6,314,040 B1 | * | 11/2001 | Reynolds | 365/226 |
| 6,801,060 B2 | * | 10/2004 | Ikehashi et al. | 327/80 |
| 8,330,507 B2 | * | 12/2012 | Kim | 327/143 |
| 2004/0012419 A1 | * | 1/2004 | Kim et al. | 327/143 |
| 2005/0001663 A1 | * | 1/2005 | Lee | 327/158 |
| 2005/0035796 A1 | * | 2/2005 | Chun et al. | 327/143 |
| 2008/0238500 A1 | * | 10/2008 | Jung | 327/143 |
| 2010/0102866 A1 | * | 4/2010 | Suzuki et al. | 327/198 |
| 2011/0109358 A1 | * | 5/2011 | Lin | 327/158 |
| 2012/0120745 A1 | * | 5/2012 | Miyano et al. | 365/193 |
| 2012/0212270 A1 | * | 8/2012 | Ishimatsu | 327/198 |

FOREIGN PATENT DOCUMENTS

KR   1020110037384 A   4/2011

* cited by examiner

*Primary Examiner* — Brandon S Cole

(74) *Attorney, Agent, or Firm* — William Park & Associates Patent Ltd.

(57) ABSTRACT

A semiconductor device having a power tracking circuit configured for activating a power tracking signal for a period corresponding to a period during which an external voltage retains a level lower than a level of a low power mode reference voltage if the external voltage retains the level lower than the level of the low power mode reference voltage for at least a preselected time.

18 Claims, 8 Drawing Sheets

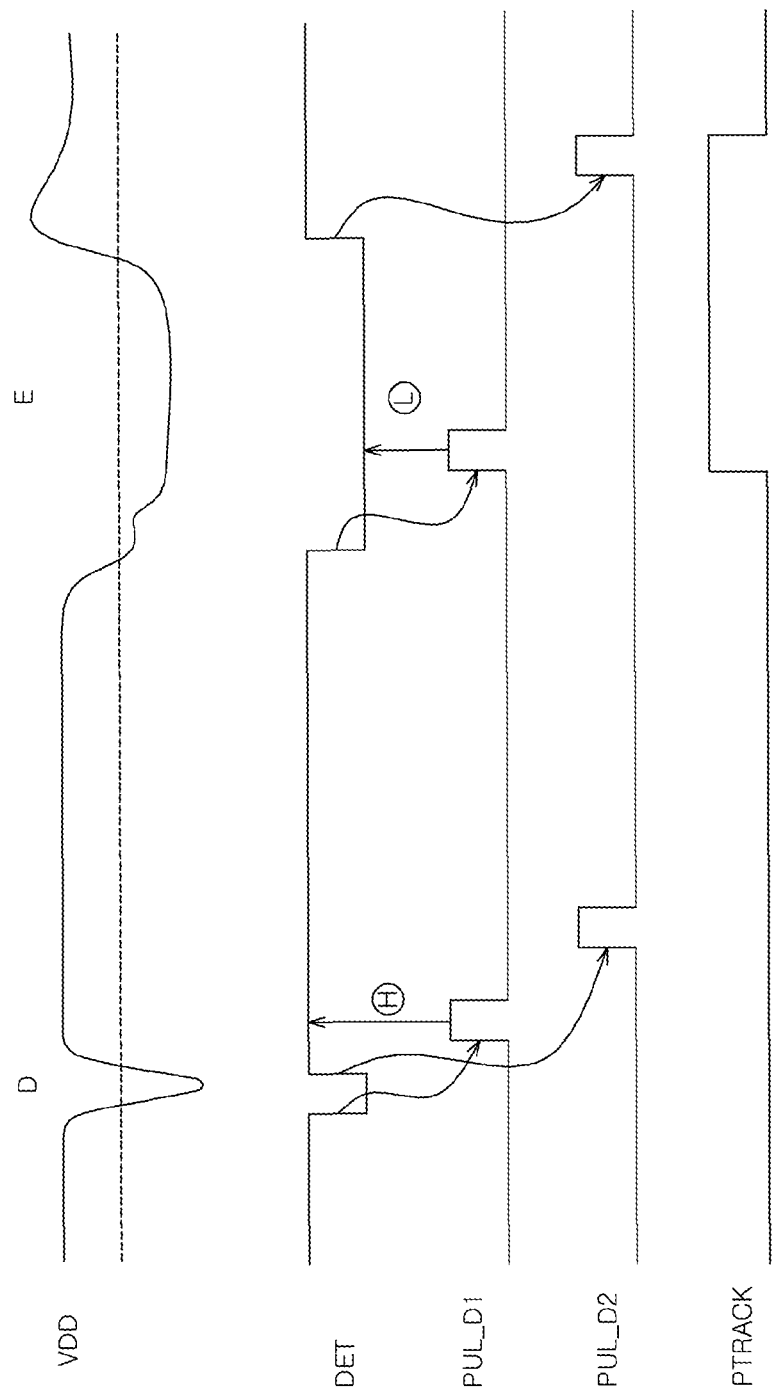

4_1

4_2

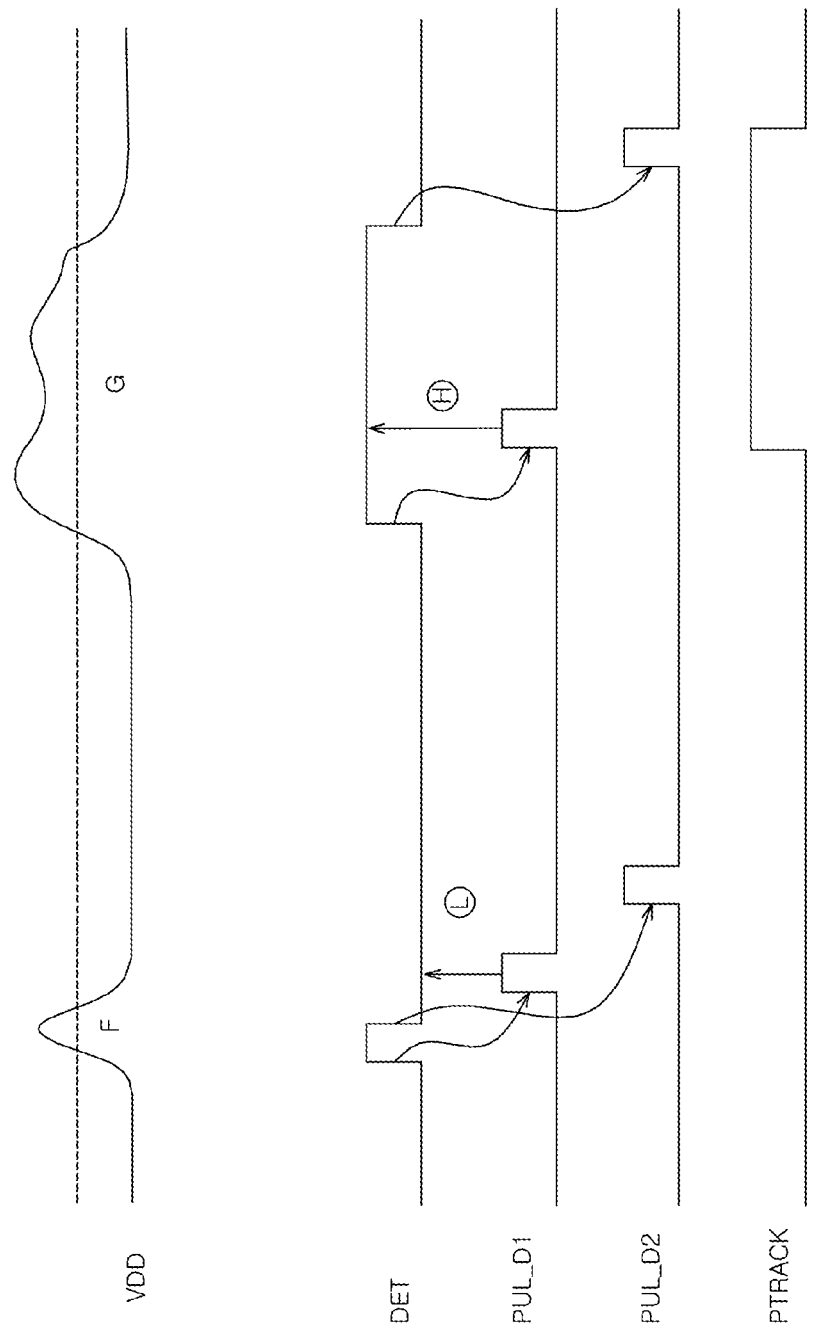

4_1

4_2

POWER TRACKING CIRCUIT AND SEMICONDUCTOR APPARATUS INCLUDING THE SAME

CROSS-REFERENCES TO RELATED APPLICATION

The present application claims priority under 35 U.S.C. §119(a) to Korean application number 10-2012-0059297 filed on Jun. 1, 2012 in the Korean Intellectual Property Office, which is incorporated herein by reference in its entirety.

BACKGROUND

1. Technical Field

The present invention generally relates to a semiconductor integrated circuit, and more particularly, to a power tracking circuit and a semiconductor apparatus including the same.

2. Related Art

A semiconductor device is applied with power from an external source and uses the power to drive an internal circuit. Accordingly, it is important to provide a stable external voltage to obtain a stable and reliable result from a semiconductor device.

FIG. 1 is a view showing a situation in which a fail occurs according to a variation in the level of an external voltage VDD in the conventional art.

In the case of A (i.e. pass), although the level of the external voltage VDD slightly decreases, since the slight decrease is not such an extent to exert an influence on the operation of a semiconductor device, the semiconductor device as a whole normally operates. Also, in the case of B (i.e., pass), although the level of the external voltage VDD abruptly decreases by a large extent, since the level of the external voltage VDD is quickly recovered, the semiconductor device as a whole normally operates.

However, in the case of C (i.e., fail), since the level of the external voltage VDD decreases by a large extent and the decreased level is retained for a lengthy time, an error is likely to occur in the operation of the semiconductor device as a whole.

In general, in the voltage generation block of a semiconductor device, a voltage variation is detected and a detection result is fed back to allow a constant voltage to be generated. For example, the semiconductor device has a voltage detection circuit which detects that an external voltage changes and an internal voltage drops below a predetermined reference voltage, to allow the internal voltage to be recovered.

Nevertheless, by the voltage detection circuit, a reaction is unnecessarily made even when the level of the external voltage VDD abruptly decreased is quickly recovered as in the case of B in FIG. 1. This may complicate the operation of the semiconductor device and may serve as a factor for causing an error in the operation of the semiconductor device.

SUMMARY

In an embodiment, a power tracking circuit configured for activating a power tracking signal for a period corresponding to a period during which an external voltage retains a level lower than a level of a low power mode reference voltage if the external voltage retains the level lower than the level of the low power mode reference voltage for at least a preselected time.

In an embodiment, a power tracking circuit configured for activating a power tracking signal for a period corresponding to a period during which an external voltage retains a level higher than a level of a high power mode reference voltage if the external voltage retains the level higher than the level of the high power mode reference voltage for at least a preselected time.

In an embodiment, a power tracking circuit includes: a voltage detection unit configured to detect a level of an external voltage on the basis of a reference voltage and generate a detection signal; a first pulse generation unit configured to generate a first pulse signal when a level of the detection signal transitions from a first level to a second level; a first delay unit configured to delay the first pulse signal by a first predetermined time; a set signal generation unit configured to activate a set signal if, when at an activation timing of the delayed first pulse signal the detection signal retains the second level; a second pulse generation unit configured to generate a second pulse signal when a level of the detection signal transitions from the second level to the first level; a second delay unit configured to delay the second pulse signal by a second predetermined time; a reset signal generation unit configured to activate a reset signal if, when at an activation timing of the delayed second pulse signal the detection signal retains the first level; and a latch unit configured to activate a power tracking signal in response to the set signal and deactivate the power tracking signal in response to the reset signal.

In an embodiment, a semiconductor device includes: a power tracking circuit configured for activating a power tracking signal for a period corresponding to a period during which an external voltage retains a level lower than a level of the low power mode reference voltage if the external voltage retains the level lower than the level of the low power mode reference voltage for at least a preselected time; and a repeater configured to receive input signals, drive the external voltage in response to the input signals when an enable signal is activated, and generate an output signal, wherein, when the repeater generates the output signal by driving the external voltage, the repeater increases a force for driving the external voltage when the power tracking signal is activated.

In an embodiment, a semiconductor device includes: a power tracking circuit configured for activating a power tracking signal for a period corresponding to a period during which an external voltage retains a level lower than a level of a low power mode reference voltage if the external voltage retains the level lower than the level of the low power mode reference voltage for at least a preselected time; and a delay-locked loop configured to compare phases of a feedback clock acquired by delaying a DLL clock by a model delay value and an external clock, delay the external clock in correspondence to a phase difference, and generate the DLL clock, wherein the delay-locked loop shortens an update cycle for comparing the phases of the feedback clock and the external clock when the power tracking signal is activated.

In an embodiment, a semiconductor device includes: a power tracking circuit configured for activating a power tracking signal for a period corresponding to a period during which an external voltage retains a level lower than a level of a low power mode reference voltage if the external voltage retains the level lower than the level of the low power mode reference voltage for at least a preselected time; and a delay-locked loop including a variable delay unit configured to delay an external clock by a predetermined delay unit in response to a phase detection signal applied with a predetermined cycle and generate a DLL clock, a delay model unit configured to delay the DLL clock by a model delay value and generate a feedback clock, and a phase comparison unit configured to compare phases of the feedback clock and the external clock with the predetermined cycle and generate the phase detection signal according to a comparison result, wherein the variable delay unit increases a delay amount of the predetermined delay unit when the power tracking signal is activated.

BRIEF DESCRIPTION OF THE DRAWINGS

Features, aspects, and embodiments are described in conjunction with the attached drawings, in which:

FIG. 3 is a waveform diagram according to an embodiment of the power tracking circuit of FIG. 2;

FIG. 5 is a waveform diagram according to an embodiment of the power tracking circuit of FIG. 2;

DETAILED DESCRIPTION

Hereinafter, a power tracking circuit and a semiconductor apparatus including the same according to various embodiments will be described below with reference to the accompanying drawings through the various embodiments.

Figure 1:
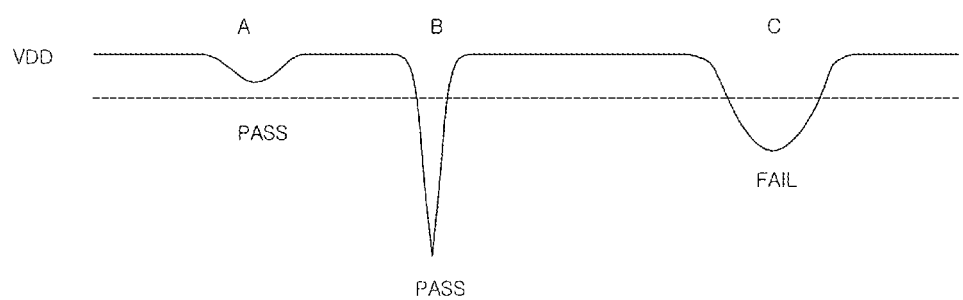
FIG. 1 is a view showing a situation in which a fail occurs according to a variation in the level of an external voltage in the conventional art.
Figure 2:
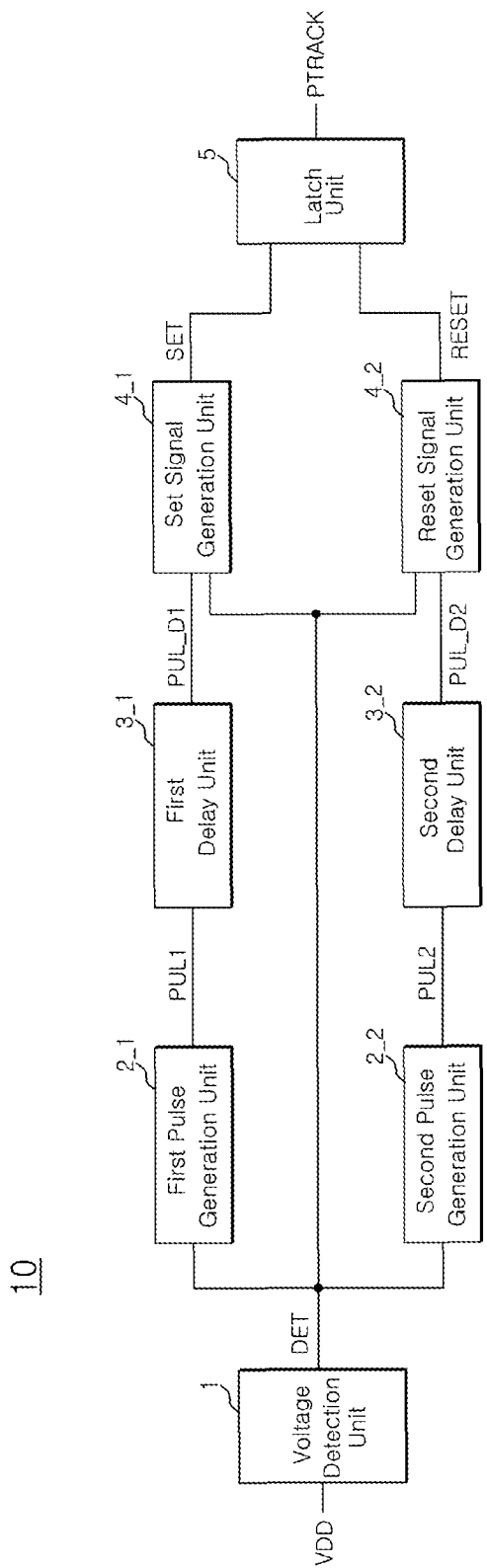
FIG. 2 is a block diagram showing a power tracking circuit in accordance with an embodiment.

FIG. 2 is a block diagram showing a power tracking circuit in accordance with an embodiment.

A power tracking circuit 10 may include a voltage detection unit 1, first and second pulse generation units 2_1 and 2_2, first and second delay units 3_1 and 3_2, a set signal generation unit 4_1, a reset signal generation unit 4_2, and a latch unit 5.

The voltage detection unit 1 may be configured to detect the level of an external voltage VDD on the basis of a reference voltage (not shown) and generate a detection signal DET.

The first pulse generation unit 2_1 may be configured to generate a first pulse signal PUL1 when the level of the detection signal DET transitions from a first level to a second level.

The first delay unit 3_1 may be configured to delay the first pulse signal PUL1 by a first predetermined time and output a first delayed pulse signal PUL_D1.

The set signal generation unit 4_1 may be configured to activate a set signal SET in the case where the detection signal DET retains the second level at the activation timing of the first delayed pulse signal PUL_D1.

The second pulse generation unit 2_2 may be configured to generate a second pulse signal PUL2 when the level of the detection signal DET transitions from the second level to the first level.

The second delay unit 3_2 may be configured to delay the second pulse signal PUL2 by a second predetermined time and output a second delayed pulse signal PUL_D2.

The reset signal generation unit 4_2 may be configured to activate a reset signal RESET in the case where the detection signal DET retains the first level at the activation timing of the second delayed pulse signal PUL_D2.

The latch unit 5 may be configured to activate a power tracking signal PTRACK in response to the set signal SET and deactivate the power tracking signal PTRACK in response to the reset signal RESET.

In an embodiment, the power tracking circuit shown in FIG. 2 may be designed to activate the power tracking signal PTRACK in the case where the external voltage VDD retains a voltage level lower than a low power mode reference voltage for a preselected time. Also, in an embodiment, the power tracking circuit shown in FIG. 2 may be designed to activate the power tracking signal PTRACK in the case where the external voltage VDD retains a voltage level higher than a high power mode reference voltage for a preselected time.

That is to say, the power tracking circuit in accordance with an embodiment has a feature in that it is possible to track the level of the external voltage VDD when the external voltage VDD does not retain a constant level but substantially continuously retains an unstable level such as a higher or lower level.

FIG. 3 as an embodiment of FIG. 2 is a waveform diagram showing the operations of the power tracking circuit capable of tracking the level of the external voltage VDD in the case where the external voltage VDD retains a voltage level lower than a low power mode reference voltage for a preselected time.

Initially, in a first situation, the external voltage VDD constantly retains a normal level, abruptly drops due to an external factor, etc., and then recovers the normal level within a short time (see D). Thereafter, in a second situation, the external voltage VDD drops again and recovers the normal level after a relatively lengthy time elapses (see E). Operations of the power tracking circuit in accordance with an embodiment in the case where the external voltage VDD changes in this way will be described below.

The voltage detection unit 1 may generate the detection signal DET of a first level (a high level (i.e., H) in an embodiment shown on FIG. 3) in the case where the level of the external voltage VDD is higher than the low power mode reference voltage, and may generate the detection signal DET of a second level (a low level (i.e., L) in an embodiment shown on FIG. 3) in the case where the level of the external voltage VDD is lower than the low power mode reference voltage.

The first pulse generation unit 2_1 may generate the first pulse signal PUL1 (see FIG. 2) which is activated at the time when the detection signal DET transitions from the high level to the low level. The first pulse signal PUL1 may be delayed by the first predetermined time and may be outputted as the first delayed pulse signal PUL_D1, by the first delay unit 3_1.

Conversely, the second pulse generation unit 2_2 may generate the second pulse signal PUL2 which is activated at the time when the detection signal DET transitions from the low level to the high level. The second pulse signal PUL2 may be delayed by the second predetermined time and may be outputted as the second delayed pulse signal PUL_D2, by the second delay unit 3_2. The first and second pulse generation units 2_1 and 2_2 may be realized by pulse generators generally known in the art.

The set signal generation unit 4_1 may activate the set signal SET in the case where the detection signal DET continuously retains the low level at the time when the first delayed pulse signal PUL_D1 is activated. That is to say, while the set signal SET is not activated in the case where the level of the external voltage VDD is recovered immediately after it abruptly drops, the set signal SET is activated in the case where the level of the external voltage VDD is not recovered until a first preselected time elapses.

Therefore, while the set signal SET is not activated in the case of D, the set signal SET is activated in the case of E.

Figure 4A:
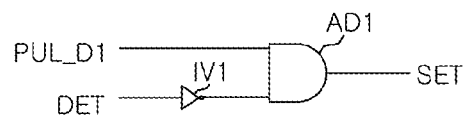
FIGS. 4a and 4b are circuit diagrams showing a set signal generation unit and a reset signal generation unit according to an embodiment of FIG. 3.

In detail, the set signal generation unit 4_1 may be realized as shown in FIG. 4*a*.

The set signal generation unit 4_1 of FIG. 4*a* may include a first inverter IV1 and a first AND gate AD1.

The first inverter IV1 inverts the detection signal DET, and the first AND gate AD1 receives the first delayed pulse signal PUL_D1 and the inverted signal of the detection signal DET and outputs the set signal SET. Accordingly, if the detection signal DET retains the low level when the first delayed pulse signal PUL_D1 is activated, the set signal SET is activated.

The latch unit 5 activates the power tracking signal PTRACK in response to the set signal SET. The latch unit 5 may be constituted by, for example, an SR latch or the like. While the power tracking signal PTRACK is not activated in the case of D since the set signal SET is not activated, the power tracking signal PTRACK is activated in the case of E since the set signal SET is activated.

After the latch unit 5 generates the activated power tracking signal PTRACK by the set signal SET, the latch unit 5 deactivates the power tracking signal PTRACK when the activated reset signal RESET is applied.

The reset signal generation unit 4_2 activates the reset signal RESET in the case where the detection signal DET continuously retains the high level at the time when the second delayed pulse signal PUL_D2 is activated. That is to say, while the reset signal RESET is not activated in the case where the level of the external voltage VDD drops immediately after it is recovered to a normal level, the reset signal RESET is activated in the case where the level of the external voltage VDD does not drop and retains the normal level until a second preselected time elapses. In the cases of both D and E, since the detection signal DET retains the high level at the time when the second delayed pulse signal PUL_D2 is activated, the activated reset signal RESET is generated. The first and second preselected times may be set to have appropriate values, according to the specification of a semiconductor.

Figure 4B:
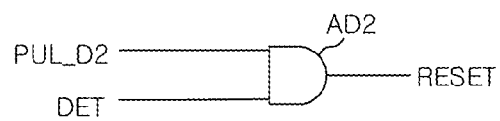

In detail, the reset signal generation unit 4_2 may be realized as shown in FIG. 4*b*.

The reset signal generation unit 4_2 of FIG. 4*b* may include a second AND gate AD2.

The second AND gate AD2 may receive the second delayed pulse signal PUL_D2 and the detection signal DET and outputs the reset signal RESET. Therefore, if the detection signal DET retains the high level when the second delayed pulse signal PUL_D2 is activated, the reset signal RESET is activated.

As a result, in the case of D, since the latch unit 5 is not activated by the reset signal SET, even though the activated reset signal RESET is applied, no influence is exerted on the operation of the latch unit 5. Conversely, in the case of E, since the latch unit 5 is activated by the set signal SET, if the activated reset signal RESET is applied, the power tracking signal PTRACK is deactivated.

Thus, in the case where the external voltage VDD is supplied as low power for a relatively lengthy time, this situation may be detected by activating the power tracking signal PTRACK. By using the power tracking signal PTRACK at a proper place of a semiconductor device, a misoperation of the semiconductor device due to a low power mode may be prevented.

FIG. 5 as an embodiment of FIG. 2 is a waveform diagram showing the operations of the power tracking circuit capable of tracking the level of the external voltage VDD in the case where the external voltage VDD retains a voltage level higher than a high power mode reference voltage for a preselected time.

Initially, in a first situation, the external voltage VDD may constantly retain a normal level, abruptly rise due to an external factor, etc., and then recover the normal level within a short time (see F). Thereafter, in a second situation, the external voltage VDD may rise again and recover the normal level after a relatively lengthy time elapses (see G). Operations of the power tracking circuit in accordance with an embodiment in the case where the external voltage VDD changes in this way will be described below.

The voltage detection unit 1 may generate the detection signal DET of a first level (a low level (i.e., L) in an embodiment) in the case where the level of the external voltage VDD is lower than the high power mode reference voltage, and may generate the detection signal DET of a second level (a high level (i.e., H) in an embodiment) in the case where the level of the external voltage VDD is higher than the high power mode reference voltage.

The first pulse generation unit 2_1 may generate the first pulse signal PUL1 which is activated at the time when the detection signal DET transitions from the low level to the high level. The first pulse signal PUL1 is delayed by the first predetermined time and is outputted as the first delayed pulse signal PUL_D1, by the first delay unit 3_1.

Conversely, the second pulse generation unit 2_2 may generate the second pulse signal PUL2 which is activated at the time when the detection signal DET transitions from the high level to the low level. The second pulse signal PUL2 is delayed by the second predetermined time and is outputted as the second delayed pulse signal PUL_D2, by the second delay unit 3_2. The first and second pulse generation units 2_1 and 2_2 may be realized by pulse generators generally known in the art.

The set signal generation unit 4_1 may activate the set signal SET in the case where the detection signal DET continuously retains the high level at the time when the first delayed pulse signal PUL_D1 is activated. That is to say, while the set signal SET is not activated in the case where the level of the external voltage VDD is recovered immediately after it abruptly rises, the set signal SET is activated in the case where the level of the external voltage VDD is not recovered until a first preselected time elapses.

Therefore, while the set signal SET is not activated in the case of F, the set signal SET is activated in the case of G.

Figure 6A:
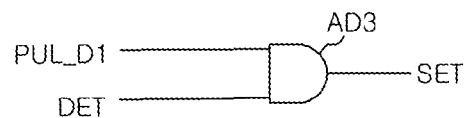
FIGS. 6a and 6b are circuit diagrams showing a set signal generation unit and a reset signal generation unit according to an embodiment of FIG. 5.

In detail, the set signal generation unit 4_1 may be realized as shown in FIG. 6*a*.

The set signal generation unit 4_1 of FIG. 6*a* may include a third AND gate AD3.

The third AND gate AD3 may receive the first delayed pulse signal PUL_D1 and the detection signal DET and output the set signal SET. Accordingly, if the detection signal DET retains the high level when the first delayed pulse signal PUL_D1 is activated, the set signal SET is activated.

The latch unit 5 activates the power tracking signal PTRACK in response to the set signal SET. The latch unit 5 may be constituted by, for example, an SR latch or the like. While the power tracking signal PTRACK is not activated in the case of F since the set signal SET is not activated, the power tracking signal PTRACK is activated in the case of G since the set signal SET is activated.

After the latch unit 5 generates the activated power tracking signal PTRACK by the set signal SET, the latch unit 5 deactivates the power tracking signal PTRACK when the activated reset signal RESET is applied.

The reset signal generation unit 4_2 may activate the reset signal RESET in the case where the detection signal DET continuously retains the low level at the time when the second delayed pulse signal PUL_D2 is activated. That is to say, while the reset signal RESET is not activated in the case where the level of the external voltage VDD rises immediately after it is recovered to a normal level, the reset signal RESET is activated in the case where the level of the external voltage VDD does not rise and retains the normal level until a second preselected time elapses. In the cases of both F and G, since the detection signal DET retains the low level at the time when the second delayed pulse signal PUL_D2 is activated, the activated reset signal RESET is generated. The first and second preselected times may be set to have appropriate values, according to the specification of a semiconductor.

Figure 6B:
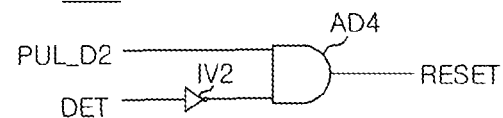

In detail, the reset signal generation unit 4_2 may be realized as shown in FIG. 6b.

The reset signal generation unit 4_2 of FIG. 6b may include a second inverter IV2 and a fourth AND gate AD4.

The second inverter IV2 inverts the detection signal DET, and the fourth AND gate AD4 receives the second delayed pulse signal PUL_D2 and the inverted signal of the detection signal DET and outputs the reset signal RESET. Therefore, if the detection signal DET retains the low level when the second delayed pulse signal PUL_D2 is activated, the reset signal RESET is activated.

As a result, in the case of F, since the latch unit 5 is not activated by the reset signal SET, even though the activated reset signal RESET is applied, no influence is exerted on the operation of the latch unit 5. Conversely, in the case of G, since the latch unit 5 is activated by the set signal SET, if the activated reset signal RESET is applied, the power tracking signal PTRACK is deactivated.

Thus, in the case where the external voltage VDD is supplied as high power for a relatively lengthy time, this situation may be detected by activating the power tracking signal PTRACK. By using the power tracking signal PTRACK at a proper place of a semiconductor device, a misoperation of the semiconductor device due to a high power mode may be prevented.

Figure 7:
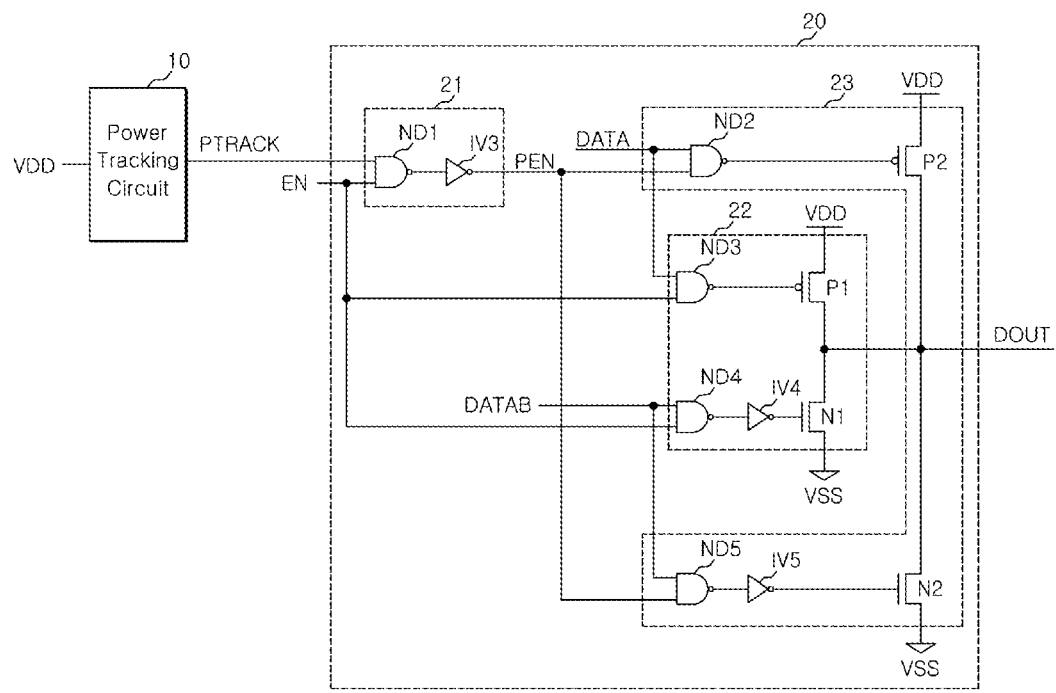
FIG. 7 is a view showing a semiconductor device in accordance with an embodiment, including the power tracking circuit of FIG. 2.

FIG. 7 is a circuit diagram showing an embodiment of a semiconductor device which uses the power tracking circuit for detecting a low power mode, in a repeater.

In general, a repeater may be used to transmit or output a signal such as data or a clock and may drive an output signal using an external voltage. Hence, in the case where the external voltage is supplied in a low power mode, since it is difficult to drive a normal output signal, normal transfer of a signal is not implemented, and a misoperation of a semiconductor device as a whole may be caused.

An embodiment of a semiconductor device shown in FIG. 7 may include the power tracking circuit 10 for detecting a low power mode in accordance with an embodiment and a repeater 20.

As described above, in the case where the external voltage VDD retains a voltage level lower than a low power mode reference voltage for at least a preselected time, the power tracking circuit 10 activates the power tracking signal PTRACK for a corresponding period. Accordingly, it is possible to detect a period in which the power tracking circuit 10 operates in the low power mode.

The repeater 20 may be configured to drive the external voltage VDD in response to input signals DATA and DATAB when an enable signal EN is activated and generate an output signal DOUT, and has a feature in that it increases a driving force for the external voltage VDD when the power tracking signal PTRACK is activated. The enable signal EN is a signal which is provided from an outside or the inside of the semiconductor device to determine whether to enable the repeater 20.

Additionally, the repeater 20 may include an additional enable signal generation unit 21, a normal driver 22, and an additional driver 23.

The additional enable signal generation unit 21 may be configured to activate an additional enable signal PEN when both the power tracking signal PTRACK and the enable signal EN are activated. In other words, the additional enable signal generation unit 21 may activate the additional enable signal PEN in the case where the operation is performed in the low power mode when the repeater 20 is enabled.

In detail, the additional enable signal generation unit 21 may include a first NAND gate ND1 which receives the power tracking signal PTRACK and the enable signal EN and a third inverter IV3 which inverts the output of the first NAND gate ND1.

The normal driver 22 may be configured to drive the external voltage VDD in response to the input signals DATA and DATAB when the enable signal EN is activated, and generate the output signal DOUT. In an embodiment, first data DATA and second data DATAB with an inverted level of the first data DATA are received as the input signals, and output data is transmitted as the output data DATA.

Additionally, the normal driver 22 may include third and fourth NAND gates ND3 and ND4, a fourth inverter IV4, a first PMOS transistor P1, and a first NMOS transistor N1.

The third NAND gate ND3 receives the enable signal EN and the first data DATA.

The first PMOS transistor P1 receives the output signal of the third NAND gate ND3, drives the external voltage VDD, and generates the output data DATA.

The fourth NAND gate ND4 receives the enable signal EN and the second data DATAB.

The fourth inverter IV4 inverts the output signal of the fourth NAND gate ND4.

The first NMOS transistor N1 receives the output signal of the fourth inverter IV4 and discharges the output signal DOUT to the level of a ground voltage VSS.

Namely, the normal driver 22 outputs the output signal DOUT of a high level in the case where the first data DATA of a high level and the second data DATAB of a low level are received, and outputs the output signal DOUT of a low level in the case where the first data DATA of a low level and the second data DATAB of a high level are received.

The additional driver 23 may be configured to additionally drive the external voltage VDD in response to the input signals DATA and DATAB when the additional enable signal PEN is activated, and generate the output signal DOUT.

Additionally, the additional driver 23 may include second and fifth NAND gates ND2 and ND5, a fifth inverter 1V5, a second PMOS transistor P2, and a second NMOS transistor N2.

The second NAND gate ND2 receives the additional enable signal PEN and the first data DATA.

The second PMOS transistor P2 receives the output signal of the second NAND gate ND2, drives the external voltage VDD and generates the output signal DOUT.

The fifth NAND gate ND5 receives the additional enable signal PEN and the second data DATAB.

The fifth inverter IV5 inverts the output signal of the fifth NAND gate ND5.

The second NMOS transistor N2 receives the output signal of the fifth inverter IV5 and discharges the output signal DOUT to the level of the ground voltage VSS.

As a consequence, the repeater 20 in accordance with an embodiment transmits the input signals by driving only the normal driver 22 in a normal mode. Further, the repeater 20 in accordance with an embodiment transmits the input signals by driving the normal driver 22 together with the additional driver 23 in the low power mode. Therefore, data loss likely to occur in the low power mode may be prevented, and the semiconductor device may operate normally.

Figure 8:
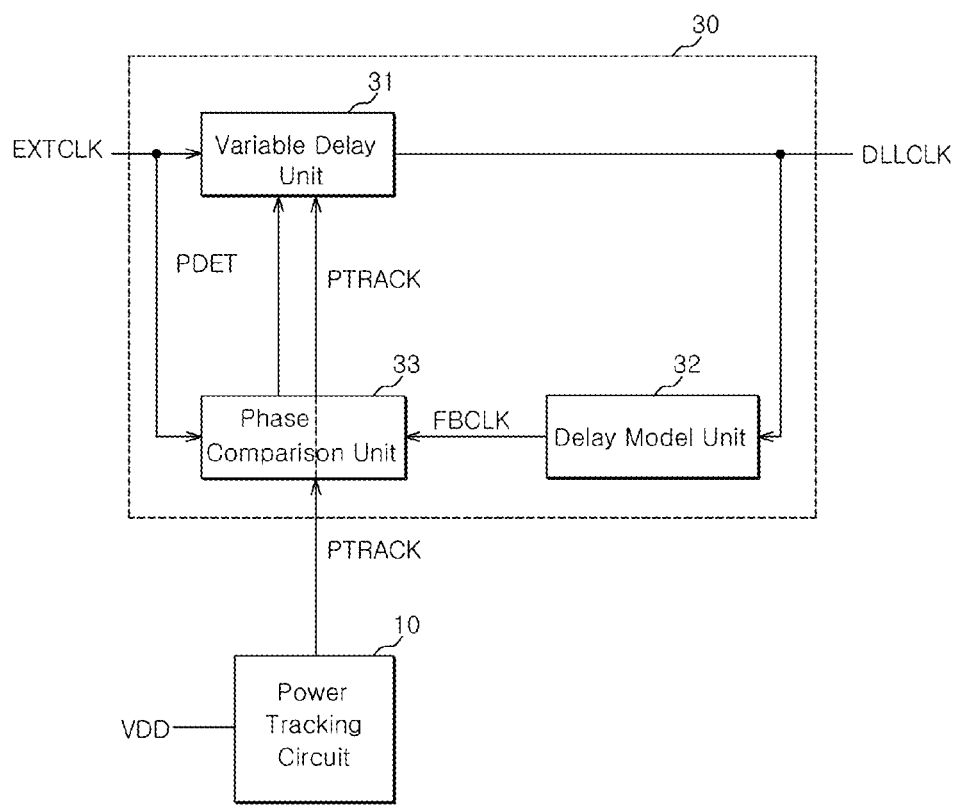
FIG. 8 is a view showing a semiconductor device in accordance with an embodiment, including the power tracking circuit of FIG. 2.

FIG. 8 is a view showing an embodiment of a semiconductor device in which the power tracking circuit for detecting a low power mode is employed in a delay-locked loop.

A semiconductor device may operate by a clock synchronization system to match operation timing and ensure a quick operation with no error. If an external clock is used in the semiconductor device, a clock skew occurs in data to be outputted, by an internal circuit. Therefore, a delay-lock loop is provided to generate a DLL clock by compensating for a model delay value acquired by modeling the delay amount of the internal circuit of the semiconductor device, that is, a data output path. In the semiconductor device, by using the DLL clock, data may be outputted to the outside in synchronization with the external clock.

In general, a delay-locked loop may include a variable delay unit configured to delay the external clock by a predetermined delay unit in response to a phase detection signal applied with a predetermined cycle and generate the DLL clock, a delay model unit configured to delay the DLL clock by the model delay value and generate a feedback clock, and a phase comparison unit configured to compare the phases of the feedback clock and the external clock with the predetermined cycle and generate the phase detection signal according to a comparison result. That is to say, according to a result of comparing the phases of the external clock and the feedback clock with the predetermined cycle, the external clock is delayed and the DLL clock is generated.

If the semiconductor device operates in a low power mode instead of a normal mode, the delay amount of the entire semiconductor circuit changes. Accordingly, if such a change is not quickly reflected on the delay-locked loop, the semiconductor device may not operate in precise synchronization with an external device.

An embodiment of a semiconductor device shown in FIG. 8 may include the power tracking circuit 10 for detecting a low power mode in accordance with an embodiment and a delay-locked loop 30.

As described above, in the case where the external voltage VDD retains a voltage level lower than a low power mode reference voltage for at least a preselected time, the power tracking circuit 10 activates the power tracking signal PTRACK for a corresponding period. Accordingly, it is possible to detect a period in which the power tracking circuit 10 operates in the low power mode.

The delay-locked loop 30 may include a variable delay unit 31, a delay model unit 32, and a phase comparison unit 33.

The variable delay unit 31 may be configured to delay an external clock EXTCLK by a predetermined delay unit in response to a phase detection signal PDET applied with a predetermined cycle, and generate a DLL clock DLLCLK. In the case where the power tracking signal PTRACK is activated, the delay amount of the predetermined delay unit may be increased. By this fact, it is possible to generate the DLL clock DLLCLK capable of precisely synchronizing the semiconductor device with the external device at the low power mode.

The delay model unit 32 may be configured to delay the DLL clock DLLCLK by a model delay value and generate a feedback clock FBCLK.

The phase comparison unit 33 may be configured to compare the phases of the feedback clock FBCLK and the external clock EXTCLK with the predetermined cycle and generate the phase detection signal PDET according to a comparison result. In the case where the power tracking signal PTRACK is activated, the cycle for comparing the phases of the feedback clock FBCLK and the external clock EXTCLK may be shortened. By this fact, it is possible to generate the DLL clock DLLCLK capable of quickly synchronizing the semiconductor device with the external device at the low power mode.

In other words, while the delay-locked loop according to an embodiment operates normally in the normal mode, when the low power mode is detected, the delay-locked loop may be caused to operate more quickly than in the normal mode. Therefore, as a clock skew capable of occurring in the low power mode is quickly removed, it is possible to prevent the misoperation of the semiconductor device.

While various embodiments have been described above, it will be understood to those skilled in the art that the embodiments described are by way of example only. Accordingly, the power tracking circuit and the semiconductor apparatus including the same described herein should not be limited based on the described embodiments.

What is claimed is:

1. A power tracking circuit comprising:
   a voltage detection unit configured to detect a level of an external voltage on the basis of a reference voltage and generate a detection signal;
   a first pulse generation unit configured to generate a first pulse signal when a level of the detection signal transitions from a first level to a second level;
   a first delay unit configured to delay the first pulse signal by a first predetermined time;
   a set signal generation unit configured to activate a set signal if, when at an activation timing of the delayed first pulse signal the detection signal retains the second level;
   a second pulse generation unit configured to generate a second pulse signal when a level of the detection signal transitions from the second level to the first level;
   a second delay unit configured to delay the second pulse signal by a second predetermined time;
   a reset signal generation unit configured to activate a reset signal if, when at an activation timing of the delayed second pulse signal the detection signal retains the first level; and
   a latch unit configured to activate a power tracking signal in response to the set signal and deactivate the power tracking signal in response to the reset signal.

2. The power tracking circuit according to claim 1, wherein the reference voltage is a low power mode reference voltage.

3. The power tracking circuit according to claim 2, wherein the voltage detection unit generates the detection signal of the first level if the level of the external voltage is higher than the level of the reference voltage, and generates the detection signal of the second level if the level of the external voltage is lower than the level of the reference voltage.

4. The power tracking circuit according to claim 3, wherein the first level is a high level and the second level is a low level.

5. The power tracking circuit according to claim 1, wherein the reference voltage is a high power mode reference voltage.

6. The power tracking circuit according to claim 5, wherein the voltage detection unit generates the detection signal of the first level if the level of the external voltage is lower than the level of the reference voltage, and generates the detection signal of the second level if the level of the external voltage is higher than the level of the reference voltage.

7. The power tracking circuit according to claim 6, wherein the first level is a low level and the second level is a high level.

8. A semiconductor device comprising:
a power tracking circuit configured for activating a power tracking signal for a period corresponding to a period during which an external voltage retains a level lower than a level of the low power mode reference voltage if the external voltage retains the level lower than the level of the low power mode reference voltage for at least a preselected time; and
a repeater configured to drive the external voltage in response to input signals, and generate an output signal, wherein, the repeater increases a force for driving the external voltage in response to the power tracking signal.

9. The semiconductor device according to claim 8, wherein the power tracking circuit comprises:
a voltage detection unit configured to detect the level of the external voltage on the basis of the lower power mode reference voltage and generate a detection signal;
a first pulse generation unit configured to generate a first pulse signal when a level of the detection signal transitions from a first level to a second level;
a first delay unit configured to delay the first pulse signal by a first predetermined time;
a set signal generation unit configured to activate a set signal if, when at an activation timing of the delayed first pulse signal the detection signal retains the second level;
a second pulse generation unit configured to generate a second pulse signal when a level of the detection signal transitions from the second level to the first level;
a second delay unit configured to delay the second pulse signal by a second predetermined time;
a reset signal generation unit configured to activate a reset signal if, when at an activation timing of the delayed second pulse signal the detection signal retains the first level; and
a latch unit configured to activate the power tracking signal in response to the set signal and deactivate the power tracking signal in response to the reset signal.

10. The semiconductor device according to claim 9, wherein the voltage detection unit generates the detection signal of the first level if the level of the external voltage is higher than the level of the low power mode reference voltage, and generates the detection signal of the second level if the level of the external voltage is lower than the level of the low power mode reference voltage.

11. The semiconductor device according to claim 8, wherein the repeater comprises:
a normal driver configured to drive an output terminal using the external voltage in response to the input signals —and—the enable signal; and
an additional driver configured to drive the output terminal using the external voltage in response to the enable signal and the power tracking signal.

12. A semiconductor device comprising:
a power tracking circuit configured for activating a power tracking signal for a period corresponding to a period during which an external voltage retains a level lower than a level of a low power mode reference voltage if the external voltage retains the level lower than the level of the low power mode reference voltage for at least a preselected time; and
a delay-locked loop configured to compare phases of a feedback clock acquired by delaying a DLL clock by a model delay value and an external clock, delay the external clock in correspondence to a phase difference, and generate the DLL clock,
wherein the delay-locked loop shortens an update cycle for comparing the phases of the feedback clock and the external clock in response to the power tracking signal.

13. The semiconductor device according to claim 12, wherein the power tracking circuit comprises:
a voltage detection unit configured to detect the level of the external voltage on the basis of the lower power mode reference voltage and generate a detection signal;
a first pulse generation unit configured to generate a first pulse signal when a level of the detection signal transitions from a first level to a second level;
a first delay unit configured to delay the first pulse signal by a first predetermined time;
a set signal generation unit configured to activate a set signal if, when at an activation timing of the delayed first pulse signal the detection signal retains the second level;
a second pulse generation unit configured to generate a second pulse signal when a level of the detection signal transitions from the second level to the first level;
a second delay unit configured to delay the second pulse signal by a second predetermined time;
a reset signal generation unit configured to activate a reset signal if, when at an activation timing of the delayed second pulse signal the detection signal retains the first level; and
a latch unit configured to activate the power tracking signal in response to the set signal and deactivate the power tracking signal in response to the reset signal.

14. The semiconductor device according to claim 13, wherein the voltage detection unit generates the detection signal of the first level if the level of the external voltage is higher than the level of the low power mode reference voltage, and generates the detection signal of the second level if the level of the external voltage is lower than the level of the low power mode reference voltage.

15. The semiconductor device according to claim 12, wherein the delay-locked loop comprises:
a variable delay unit configured to control a delay amount of the external clock in response to a phase detection signal, and output the DLL clock;
a delay model unit configured to delay the DLL clock by the model delay value and generate the feedback clock; and
a phase comparison unit configured to compare the phases of the feedback clock and the external clock with the update cycle, generate the phase detection signal according to a comparison result, and shorten the update cycle in response to the power tracking signal.

16. A semiconductor device comprising:
a power tracking circuit configured for activating a power tracking signal for a period corresponding to a period during which an external voltage retains a level lower than a level of a low power mode reference voltage if the external voltage retains the level lower than the level of the low power mode reference voltage for at least a preselected time; and
a delay-locked loop including a variable delay unit configured to delay an external clock by a predetermined delay unit in response to a phase detection signal applied with a predetermined cycle and generate a DLL clock, a delay model unit configured to delay the DLL clock by a model delay value and generate a feedback clock, and a phase comparison unit configured to compare phases of the feedback clock and the external clock with the predetermined cycle and generate the phase detection signal according to a comparison result, wherein the variable delay unit increases a delay amount of the predetermined delay unit in response to the power tracking signal.

17. The semiconductor device according to claim 16, wherein the power tracking circuit comprises:
   a voltage detection unit configured to detect the level of the external voltage on the basis of the lower power mode reference voltage and generate a detection signal;
   a first pulse generation unit configured to generate a first pulse signal when a level of the detection signal transitions from a first level to a second level;
   a first delay unit configured to delay the first pulse signal by a first predetermined time;
   a set signal generation unit configured to activate a set signal if, when at an activation timing of the delayed first pulse signal the detection signal retains the second level;
   a second pulse generation unit configured to generate a second pulse signal when a level of the detection signal transitions from the second level to the first level;
   a second delay unit configured to delay the second pulse signal by a second predetermined time;
   a reset signal generation unit configured to activate a reset signal if, when at an activation timing of the delayed second pulse signal the detection signal retains the first level; and
   a latch unit configured to activate the power tracking signal in response to the set signal and deactivate the power tracking signal in response to the reset signal.

18. The semiconductor device according to claim 17, wherein the voltage detection unit generates the detection signal of the first level if the level of the external voltage is higher than the level of the low power mode reference voltage, and generates the detection signal of the second level if the level of the external voltage is lower than the level of the low power mode reference voltage.

* * * * *